United States Patent
Yamaguchi

(10) Patent No.: US 6,203,674 B1
(45) Date of Patent: *Mar. 20, 2001

(54) CONTINUOUS FORMING METHOD FOR TI/TIN FILM

(75) Inventor: Yoshihiro Yamaguchi, Nagasaki (JP)

(73) Assignee: Sony Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/204,152

(22) Filed: Dec. 3, 1998

(30) Foreign Application Priority Data

Dec. 3, 1997 (JP) .................................................. 9-332821

(51) Int. Cl.$^7$ .................................................. C23C 14/34
(52) U.S. Cl. .............................. 204/192.22; 204/192.15
(58) Field of Search ........................... 204/192.15, 192.22

(56) References Cited

U.S. PATENT DOCUMENTS

| 4,883,574 | * | 11/1989 | Dos Santos Pereina Ribeiro ..... 204/192.15 |
| 5,108,569 | * | 4/1992 | Gilboa et al. ................... 204/192.13 |
| 5,439,574 | * | 8/1995 | Kobayashi et al. .............. 204/192.12 |
| 5,489,367 | * | 2/1996 | Kubota et al. .................. 204/192.15 |
| 5,725,740 | * | 3/1998 | Raaijmakers ..................... 204/192.12 |

OTHER PUBLICATIONS

JP 6–240450 abstract Aug. 1994.*

* cited by examiner

Primary Examiner—Nam Nguyen
Assistant Examiner—Steven H. Ver Steeg
(74) Attorney, Agent, or Firm—Sonnenschein, Nath & Rosenthal

(57) ABSTRACT

In a Ti/TiN film continuous forming method, when a nitride mode TiN film is formed in a TiN film forming step, according to a correlation between the generation conditions of the nitride TiN film and the metallic mode TiN film and the pressure in the process chamber, the correlation being defined by a hysteresis characteristic having a first route in which the internal pressure in the process chamber is reduced from a high pressure state through a first branch point to a second branch point and a second route in which the internal pressure in the process chamber is increased from a low pressure state through a second branch point to the first branch point, the first and second routes being mutually different from each other at the first branch point and the second branch point, and the nitride mode TiN film being formed under a pressure condition on the first route while the metallic mode TiN film is formed under a pressure condition on the second route, the TiN film is formed under the internal pressure of the process chamber which is higher than that at the first branch point. Further, when a metallic mode TiN film is formed in the TiN film forming step, the TiN film is formed under the internal pressure of the process chamber which is lower than that at the second branch point.

7 Claims, 5 Drawing Sheets

CONTINUOUS FORMING METHOD FOR TI/TIN FILM

BACKGROUND OF THE INVENTION

The present invention relates to a continuous forming method for Ti/TiN film, and more particularly to a Ti/TiN film continuous forming method for freely controlling a TiN film forming process so that a TiN film formed has such film quality as a nitride TiN film or a metallic mode TiN film in the TiN film forming process.

Following high-integration design of semiconductor devices, more minute and more multiple layer structure is being promoted for the wiring structure. As such an enhancement in minuteness and layer-multiplicity of the wiring structure is promoted, a multiple-layer wiring technique is growing more sophisticated technologically, and the technical position which the multiple-layer wiring technique occupies in the manufacturing process for semiconductor integrated circuits is more and more important.

Particularly for semiconductor devices based on the design rule subsequent to 0.5 $\mu$m are increasingly used such a wiring structure that metal of high melting point such as titanium (hereinafter referred to as "Ti"), titanium nitride (hereinafter referred to as "TiN") or the like is laminated as barrier metal on the upper or lower surface of aluminum alloy formed as a wiring film, for example, Al—Si film, Al—Si—Cu film or the like, or on both the upper and lower surfaces thereof.

Here, the conventional laminated wiring structure having a high melting point metal film as barrier metal will be described with reference to FIGS. 1A to 1D. FIGS. 1A to 1D are cross-sectional views showing various wiring structures.

The wiring structure shown in FIG. 1A is a laminated wire comprising a Ti film 11 of 20 nm in thickness, and a TiN film 12 of 70 nm in thickness which is formed on the Ti film 11.

The wiring structure shown in FIG. 1B is a laminated wire comprising a Ti film 13 of 20 nm in thickness, a TiN/Ti film 14 of 20 nm/5 nm in thickness respectively, an Al—Cu film 15 of 500 nm in thickness and a Ti/TiN/Ti film 16 of 5 nm/100 nm/5 nm in thickness respectively, these films being successively formed in this order.

The wiring structure shown in FIG. 1C is a laminated wire comprising a Ti film 17 of 100 nm in thickness, a TiN/Ti film 18 of 20 nm/5 nm in thickness respectively, an Al—Cu film 19 of 500 nm in thickness and a TiN/Ti film 20 of 35 nm/5 nm in thickness respectively, these films being successively formed in this order.

The wiring structure shown in FIG. 1D is a laminated wire comprising a Ti film 21 of 200 nm in thickness, a TiN/Ti film 22 of 20 nm/5 nm in thickness respectively, an Al—Si film 23 of 900 nm in thickness, and a TiN film 24 of 35 nm in thickness, these films being successively formed in this order.

As described above, wires having the laminated wiring structure containing five to seven layers have been used in semiconductor devices mass-produced in the 0.35 $\mu$m design rule generation.

A so-called multi-chamber type sputtering device is used to form the laminated wiring structures shown in FIGS. 1A to 1D. Here, the construction of the multi-chamber type sputtering device will be described with reference to FIG. 2. FIG. 2 is a schematic plan view showing the construction of the multi-chamber type sputtering device.

As shown in FIG. 2, the multi-chamber type sputtering device has plural process chambers each containing a sputtering material (target) which is connected with the kind of each film formed (hereinafter referred to as "chamber"). With this multi-chamber type sputtering device, one kind of metal film is formed on a wafer by using one chamber. A wafer is sequentially fed into the plural chambers and the film formation is repeated to form a laminated film. In the multi-chamber type sputtering device, the respective wafers are sequentially processed in turn.

More specifically, the multi-chamber type sputtering device 30 includes plural chambers 32A to 32D (in the case of FIG. 2, four chambers are illustrated) in which desired targets are respectively mounted, a feeding arm 33 for feeding the wafers, a separation chamber 34 which intercommunicates with each of the chambers 32A to 32D through a gate valve (not shown), and a load lock chamber 38 which intercommunicates with the separation chamber 34 and also intercommunicates with the external through a gate valve 36.

As not shown, in each of the chambers 32A to 32D are provided a cathode electrode which will serve as a sputtering source by mounting a target of a desired sputtering material, a wafer holder for holding the wafers, a gas inlet port for reaction gas, a cryopump connected to each chamber through a discharge valve to keep the inside of the chamber under high vacuum, etc.

When a metal film is formed on a wafer by sputtering, a wafer cassette in which wafers are mounted is first automatically fed to the load lock chamber 38, and then a wafer W is fed from the wafer cassette to the separation chamber 34 by the feeding arm 33. Subsequently, the wafer W is fed into one of the chambers 32A–32D to be subjected to the sputtering process, and mounted on the wafer holder. In one of the chambers 32A–32D, a metal film is formed on the wafer on the wafer holder by the sputtering method according to a predetermined recipe.

After the film formation of the metal film is completed, the wafer is taken out from one of the chambers 32A–32D, and fed through the separation chamber 34 to the next chamber 32A, 32B, 32C or 32D to perform the similar film forming process. The wafer W thus treated is mounted on the wafer cassette of the load lock chamber 38, and the wafer cassette is taken out to the outside, thereby completing the overall process.

Such a multi-chamber type sputtering device has a restriction that the number of chambers which can be equipped is limited to three or four. Accordingly, when a multilayered film having four layers or five layer or more is formed, it is necessary to continuously form different kinds of metal films in the same chamber.

Particularly when a Ti film and TiN film are continuously formed (hereinafter referred to as "continuous formation of Ti/TiN film"), the Ti/TiN film is formed by the following process because the continuous formation thereof is relatively easy. That is, in this process, a chamber in which a Ti target is mounted is used, and argon gas (hereinafter referred to as "Ar gas") is introduced in a Ti film forming step. Further, reaction gas containing a mixture of Ar gas and nitride gas (hereinafter referred to as "$N_2$ gas") is introduced in a TiN film forming step, thereby forming a TiN film by a reactive sputtering method.

That is, when the Ti/TiN film is continuously formed, the Ti target is first sputtered while Ar gas flows, thereby forming the Ti film on the wafer, and then mixture gas of Ar gas and $N_2$ gas flows to sputter the Ti target whose surface is nitrided, thereby continuously forming the TiN film on the Ti film.

The TiN film is roughly classified into a nitride mode TiN film and a metallic mode TiN film from the viewpoint of film quality. The nitride mode TiN film is defined as a TiN film having high barrier performance which is obtained by sputtering Ti target while sufficiently exposing the surface of the Ti target to $N_2$ plasma to nitride the surface of the Ti target. On the other hand, the metallic mode TiN film is defined as a TiN film obtained by sputtering target containing a large amount of Ti components such as $Ti_2N$ or the like. The selective formation of the nitride mode TiN and the metallic mode TiN can be performed by adjusting the ratio of Ar gas and $N_2$ gas or setting the flow rate of $N_2$ to a predetermined rate or more.

The TiN film which has been hitherto used as a wiring film is the nitride mode TiN film having higher barrier performance. Accordingly, when the Ti/TiN film is continuously formed in one chamber in the above manner, it is a technical great problem whether the TiN film formed has desired film quality or not, that is, whether the TiN film formed is the nitride mode TiN film or the metallic mode TiN film.

Next, the time variation of DC power, $N_2$ gas flow rate, Ar gas flow rate and the internal pressure in the chamber in a Ti film forming step, a TiN film forming step and a Ti film forming step when a Ti/TiN/Ti film is formed by a conventional three-layer continuous forming method of Ti/TiN/Ti film will be described with reference to FIG. 3.

FIG. 3 is a time chart for the DC power, the $N_2$ gas flow rate, the Ar gas flow rate and the internal pressure in the chamber in the Ti film forming step, the TiN film forming step and the Ti film forming step.

As shown in FIG. 3, at the shift time from the Ti film forming step to the TiN film forming step and at the shift time from the TiN film forming step to the Ti film forming step, the set values of the Ar gas flow rate and the $N_2$ gas flow rate are changed to form the respective films under the optimum film forming conditions, respectively.

In the conventional method, however, as shown in the time chart of the internal pressure of the chamber, at the shift time from the Ti film forming step to the TiN film forming step, a temporary variation in pressure occurs in the process chamber when the gas type is changed from Ar gas to $N_2$ gas, and the TiN film thus formed is not the desired nitride mode TiN film, but the metallic mode TiN film in some cases. In such a situation, the nitride mode TiN having high barrier performance cannot be formed stably, so that Al may be diffused from a wiring layer into a substrate to thereby change the transistor characteristics.

SUMMARY OF THE INVENTION

Therefore, the present invention has been implemented in view of the foregoing problem, and has an object to provide a method which can stably and continuously form a Ti/TiN film while forming a TiN film having desired film quality.

The inventor of the present application has made researches into the film forming conditions of the nitride mode TiN film and the metallic mode TiN film, and finally found out that the relationship between the internal pressure of the chamber and the $N_2$ gas flow rate which defines the film forming characteristic of the nitride mode TiN film vs. the metallic mode TiN film has a hysteresis characteristic containing a first route A (indicated by arrows A) and a second route B (indicated by arrows B) different from the first route A as shown in FIG. 4. In FIG. 4, the Ar gas flow rate is set to 25 sccm.

That is, the metallic mode TiN film is formed along the first route A in which the $N_2$ gas flow rate is increased from a low internal pressure state of the chamber (for example, 2.0 mTorr) to increase the internal pressure of the chamber, so that the internal pressure of the chamber reaches from a branch point 2 (about 2.5 mTorr) to a branch point 1 (about 4.0 mTorr). In other words, when the internal pressure of the chamber is increased, the metallic mode TiN film is grown until the internal pressure of the chamber reaches the pressure at the branch point 1.

Further, when the $N_2$ gas flow rate is increased to further increase the internal pressure of the chamber from the branch point 1, the nitride mode TiN film is formed in place of the metallic mode TiN film.

Conversely, when the $N_2$ gas flow rate is reduced from a high internal pressure state of the chamber (for example, 4.5 mTorr) to reduce the internal pressure of the chamber, the internal pressure of the chamber passes through the second route B and reaches from the branch point 1 to the branch point 2. Under the internal condition of the chamber on the second route B, the nitride mode TiN film is formed. In other words, when the internal pressure of the chamber is reduced, the nitride mode TiN film is formed until the internal pressure of the chamber reaches the pressure at the branch point 2.

When the $N_2$ gas flow rate is further reduced, the metallic mode TiN film is formed in place of the nitride mode TiN film.

Accordingly, in order to form the nitride mode TiN film stably, the following conditions are needed.

1) The $N_2$ gas flow rate is set so that the internal pressure of the chamber is higher than the pressure at the branch point 1.

2) When the nitride mode TiN film is formed under a pressure condition between the branch point 1 and the branch point 2, the $N_2$ gas flow rate is set so that the internal pressure of the chamber is temporarily set to be higher than the pressure at the branch point 1, and then the $N_2$ gas flow rate is reduced so that the internal pressure of the chamber is set to a set value on the second route B.

On the other hand, in order to form the metallic mode TiN film stably, the following conditions are needed.

1) The $N_2$ gas flow rate is set so that the internal pressure of the chamber is lower than the pressure at the branch point 2.

2) When the metallic mode TiN film is formed under a pressure condition between the branch point 1 and the branch point 2, the $N_2$ gas flow rate is set so that the internal pressure of the chamber is lower than the pressure at the branch point 2, and then the $N_2$ gas flow rate is increased so that the internal pressure of the chamber is set to a set value on the first route A.

In order to attain the above object, according to a first aspect of the present invention, a Ti/TiN film continuous forming method which has been implemented on the basis of the above knowledge and includes a Ti film forming step and a TiN film forming step, a Ti/TiN film being continuously formed with the same target in a process chamber according to a sputtering method, is characterized in that when a nitride mode TiN film is formed in the TiN film forming step, according to a correlation between the generation conditions of the nitride TiN film and the metallic mode TiN film and the pressure in the process chamber, the correlation being defined by a hysteresis characteristic having a first route in which the internal pressure in the process chamber is reduced from a high pressure state through a first branch point to a second branch point and a second route in which the internal pressure in the process chamber is increased from a low pressure state through a second branch point to the first branch point, the first and second routes being mutually different from each other at the first branch point and the second branch point, and the nitride mode TiN film being formed under a pressure condition on the first route while the metallic mode TiN film is formed under a pressure condition on the second route, in the TiN film forming step the TiN film is formed under the internal pressure of the process chamber which is higher than that at the first branch point.

Further, the TiN film forming step may include a pressure control step of increasing the flow rate of gas introduced into the process chamber at a shift time from the Ti film forming step to the TiN film forming step to set the internal pressure of the process chamber to be higher than the pressure at the first branch point, and then a TiN film forming step for reducing the flow rate of the gas introduced into the process chamber to adjust the internal pressure of the process chamber to a desired pressure on the first route between the first branch point and the second branch point and form the TiN film, in place of the film formation of the TiN film under the internal pressure of the process chamber higher than that at the first branch point.

In the Ti/TiN film continuous forming method, the pressure control step may temporarily close a discharge valve of the process chamber to reduce the opening degree of the valve and set the internal pressure of the process chamber to be higher than the pressure at the first branch point, in place of the step of increasing the flow rate of the gas introduced into the process chamber to set the internal pressure of the process chamber to be higher than that at the first branch point.

According to a second aspect of the present invention, a Ti/TiN film continuous forming method which includes a Ti film forming step and a TiN film forming step, a Ti/TiN film being continuously formed with the same target in a process chamber according to a sputtering method, is characterized in that when a metallic mode TiN film is formed in the TiN film forming step, according to a correlation between the generation conditions of the nitride TiN film and the metallic mode TiN film and the pressure in the process chamber, the correlation being defined by a hysteresis characteristic having a first route in which the internal pressure in the process chamber is reduced from a high pressure state through a first branch point to a second branch point and a second route in which the internal pressure in the process chamber is increased from a low pressure state through a second branch point to the first branch point, the first and second routes being mutually different from each other at the first branch point and the second branch point, and the nitride mode TiN being formed under a pressure condition on the first route while the metallic mode TiN film is formed under a pressure condition on the second route, in the TiN film forming step the TiN film is formed under the internal pressure of the process chamber which is lower than that at the second branch point.

Further, the TiN film forming step may include a pressure control step of reducing the flow rate of gas introduced into the process chamber at a shift time from the Ti film forming step to the TiN film forming chamber to set the internal pressure of the process chamber to be lower than the pressure at the second branch point, and then a TiN film forming step for increasing the flow rate of the gas introduced into the process chamber to adjust the internal pressure of the process chamber to a desired pressure on the second route between the second branch point and the first branch point and form the TiN film, in place of the film formation of the TiN film under the internal pressure of the process chamber lower than that at the second branch point.

In the Ti/TiN film continuous forming method according to the second aspect of the present invention, the pressure control step may temporarily open a discharge valve of the process chamber to increase the opening degree of the valve and set the internal pressure of the process chamber to be lower than the pressure at the second branch point, in place of the step of reducing the flow rate of the gas introduced into the process chamber to set the internal pressure of the process chamber to be lower than that at the second branch point.

The present invention is suitably applicable to formation of a multilayer wiring structure having a Ti/TiN film with the same Ti target in a process of manufacturing a semiconductor integrated circuit such as a memory element, a logic operation element or the like which is designed in a high microstructure and with high integration.

According to the method of the present invention, a TiN film having desired film quality can be formed when a Ti film and a TiN film are continuously formed with the same target material by using a multi-chamber type sputtering device.

DETAILED DESCRIPTION OF THE PREFERRED EMBODIMENTS

Preferred embodiments according to the present invention will be described hereunder with reference to the accompanying drawings.

First Embodiment

Figure 1A:
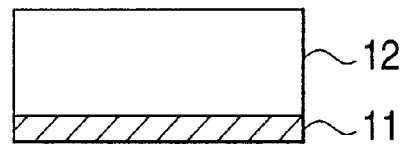
FIGS. 1A to 1D are cross-sectional views showing various wiring structures.
Figure 1B:
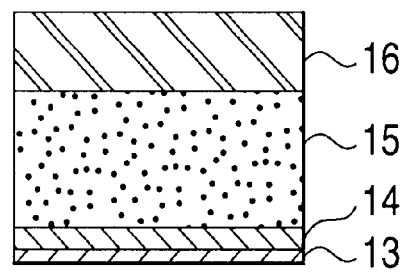
Figure 1C:
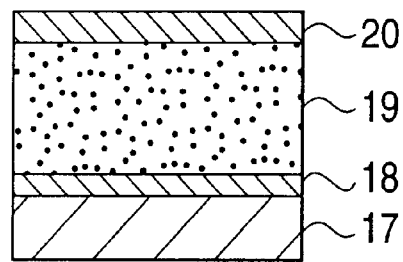
Figure 1D:
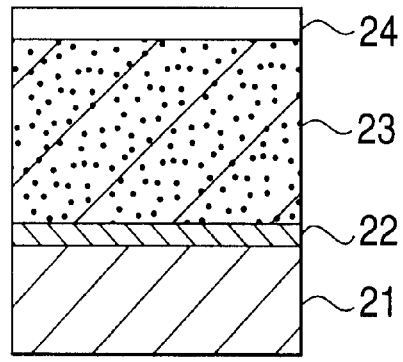
Figure 2:
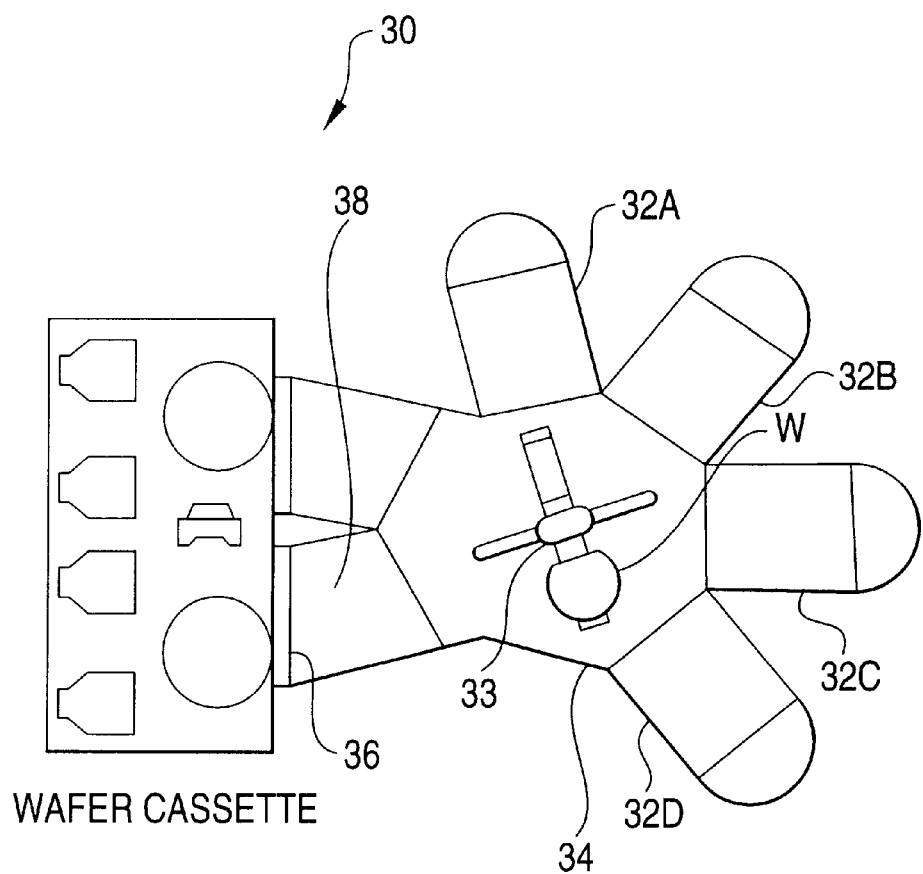
FIG. 2 is a schematic plan view showing the construction of a multi-chamber type sputtering device.
Figure 3:
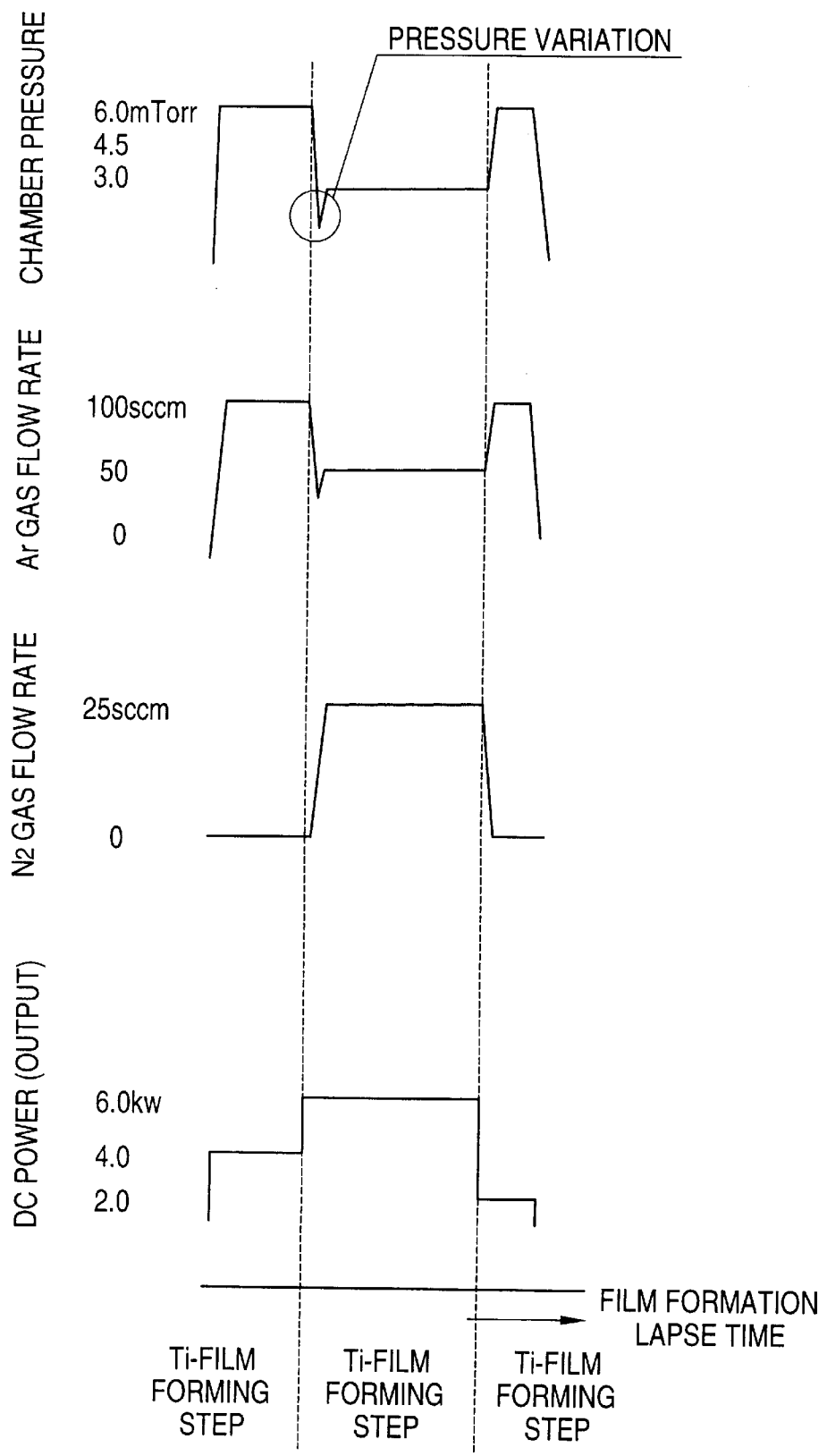
FIG. 3 is a time chart showing DC output, $N_2$ gas flow rate, Ar gas flow rate and chamber pressure when a conventional Ti/TiN film continuous forming method is applied.

In a first embodiment, the Ti/TiN film continuous film forming method according to the present invention is applied to formation of a three-layer laminated film of Ti/TiN/Ti of 20/20/5 nm in thickness. FIG. 3 is a time chart for DC output, $N_2$ gas flow rate, Ar gas flow rate and chamber pressure of the embodiment.

The Ti/TiN film continuous film forming process of this embodiment includes a first Ti film forming step, a pressure control step when the first Ti film forming step is shifted to a TiN film forming step, the TiN film forming step and a second Ti film step, and each step was carried out under the following conditions shown in FIG. 3.

The film forming condition of each step was set to the same as the conventional film forming condition except for the pressure control step.

1) First Ti film forming step
   Ar gas flow rate: 100 sccm
   $N_2$ gas flow rate: no
   Sputtering power: 4 kWDC
   Chamber pressure: 6 mTorr
   Sputtering time: 20 seconds
2) Pressure Control Step
   Ar gas flow rate: 25 sccm
   $N_2$ gas flow rate: 50 sccm
   Sputtering power: no
   Chamber pressure: 4.5 mTorr
   Sputtering time: 5 seconds
3) TiN film forming step
   Ar gas flow rate: 25 sccm
   $N_2$ gas flow rate: 25 sccm
   Sputtering power: 6 kWDC
   Chamber pressure: 3 mTorr
   Sputtering time: 30 seconds
4) Second Ti film forming step
   Ar gas flow rate: 100 sccm
   $N_2$ gas flow rate: no
   Sputtering power: 2 kWDC
   Chamber pressure: 6 mTorr
   Sputtering time: 10 seconds In this embodiment, the pressure control step is inserted at the shift time from the first Ti film forming step to the TiN film forming step as described above, whereby stable nitride mode TiN can be formed.

Second Embodiment

This embodiment is another example in which the Ti/TiN film continuous film forming method of the present invention is applied to formation of a three-layer laminated film of Ti/TiN/Ti of 20/20/5 nm in thickness. In this embodiment, the internal pressure of the chamber is controlled by adjusting the valve opening degree of a discharge valve of the chamber.

Figure 4:
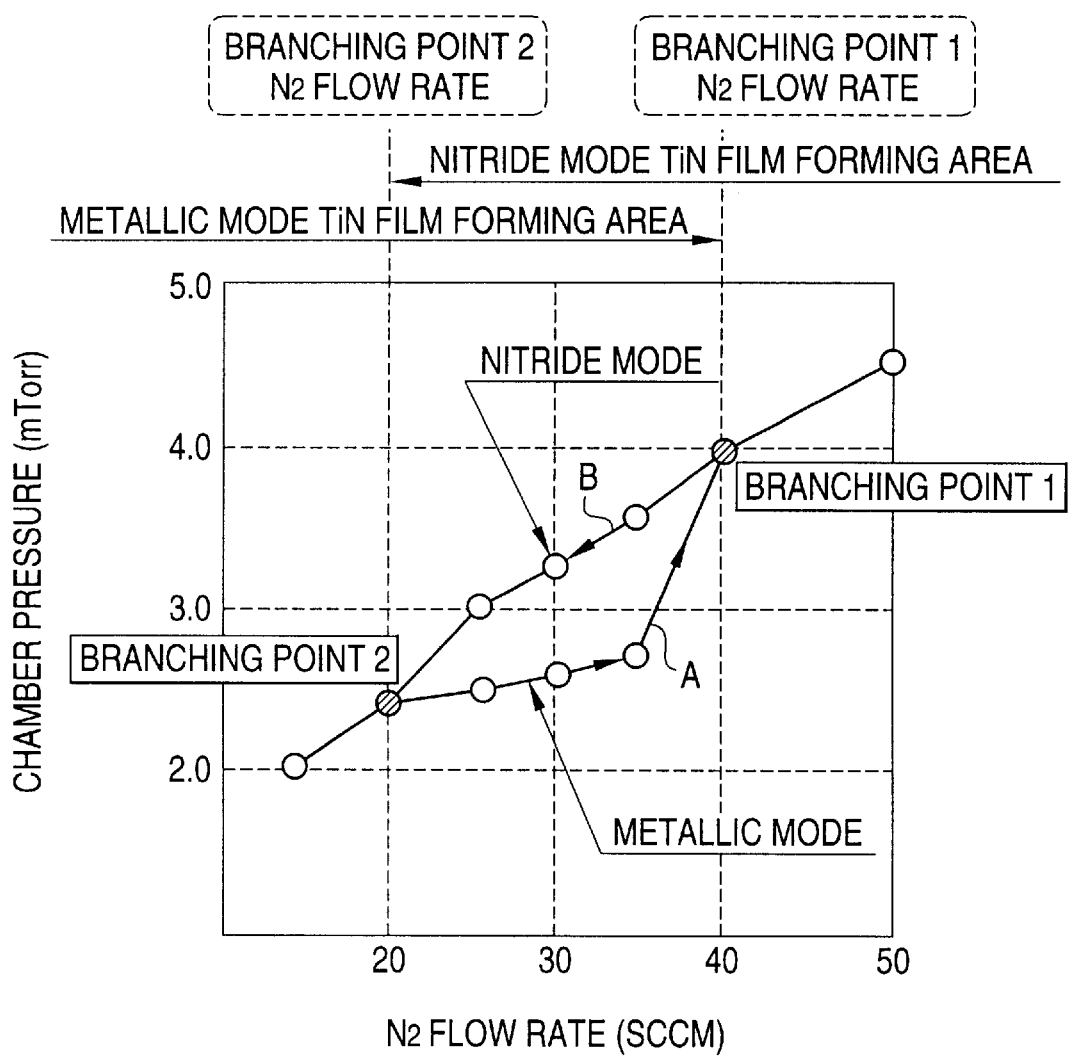
FIG. 4 is a graph showing the correlation between the internal pressure of the chamber and the $N_2$ gas flow rate, which determines the generation condition of the nitride TiN film and the generation condition of the metallic mode TiN film.
Figure 5:
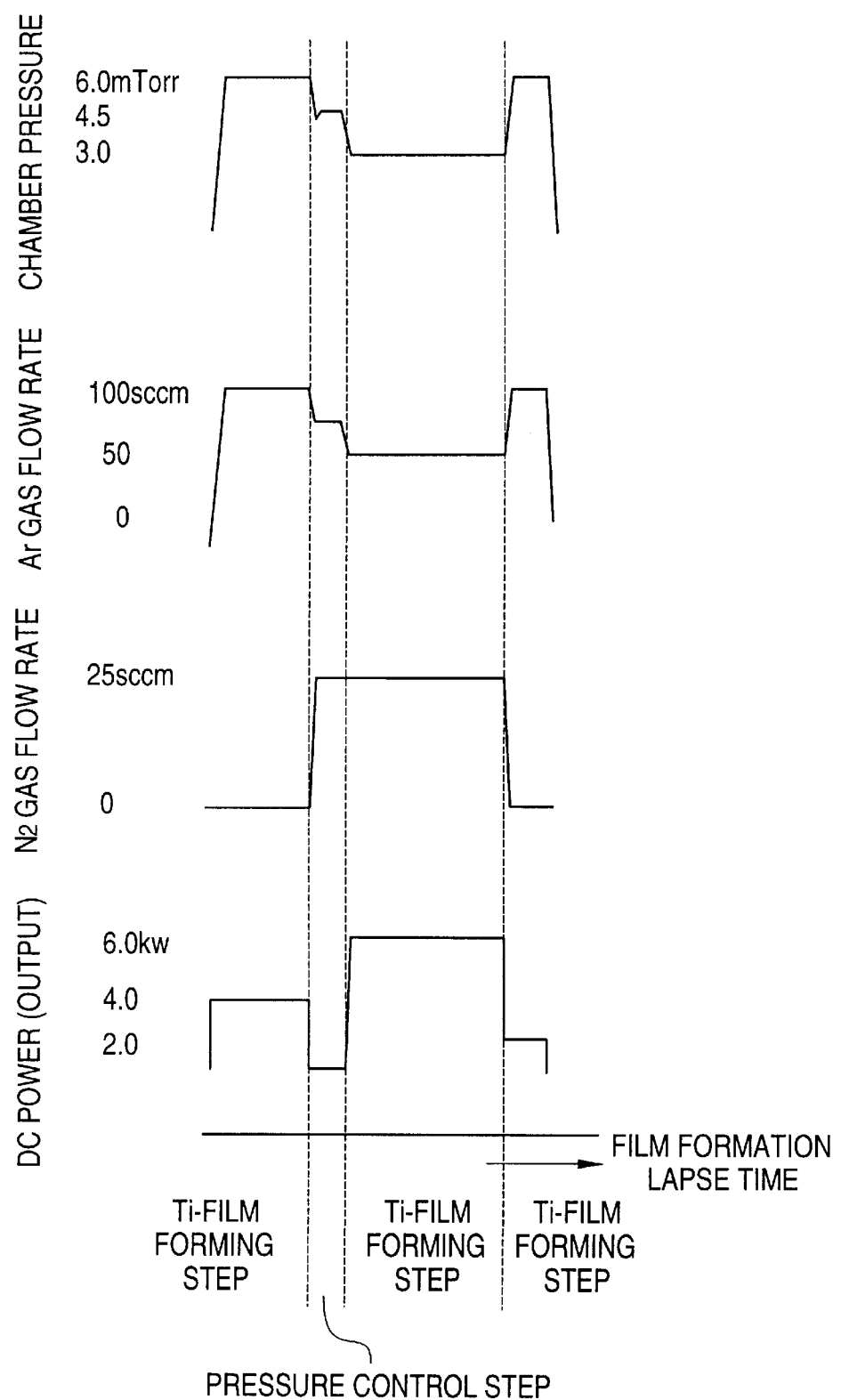
FIG. 5 is a time chart for DC output, $N_2$ gas flow rate, Ar gas flow rate and chamber pressure of an embodiment of the present invention.

In this embodiment, the Ti film was first formed in the same condition as the first Ti film forming step of the first embodiment. Subsequently, the sputtering was stopped for 10 seconds as a sputtering delay time when the processes was shifted from the Ti film forming step to the TiN film forming step. Subsequently, the opening degree of the discharge valve of the chamber was reduced to set the internal pressure of the chamber to be higher than the pressure at the branch point 1 of FIG. 4, and then the opening degree of the discharge valve was increased again, thereafter shifting the process to the TiN film forming step.

In the TiN film forming step, the TiN film was formed under the same condition as the TiN film forming step of the first embodiment. Thereafter, the Ti film was formed under the same condition as the second Ti film forming step of the first embodiment, whereby the TiN film having the same film quality as the three-layer laminated film of Ti/TiN/Ti obtained in the first embodiment could be continuously formed.

When the pressure control step cannot be executed by sequencer control or computer control, the same effect as the first embodiment can be obtained by adjusting the opening degree of the discharge valve to control the internal pressure of the chamber.

According to the present invention, the method of forming the Ti/TiN film continuously and stably with high efficiency can be implemented by setting the condition of the TiN film forming step on the basis of the correlation between the generation conditions of the nitride TiN film and the metallic mode TiN film and the internal pressure of the process chamber, the correlation being defined by a hysteresis characteristic.

The method of the present invention is most effectively used in a multilayer laminating process of the wire structure of 0.5 $\mu$m generation and subsequent generations, and it can enhance the yield of the semiconductor products. Particularly, when the present invention is used to form contact holes or Via having a high aspect ratio in the 5 $\mu$m generation and subsequent generations, a low-pressure sputtering technique is used to enhance directivity, and it becomes possible to perform film formation under a pressure value near to the discharge limit. The lower the pressure of reaction gas being used is, the more difficult the pressure control to the pressure variation in the continuous sputtering process is. Therefore, the present invention is effective more and more.

What is claimed is:

1. A method of continuously forming a Ti/TiN film by sputtering from a common target onto a substrate disposed in a pressurizable process chamber in communication with a source of $N_2$, the method comprising the following steps:
   a) sputtering a Ti film onto the substrate;
   b) introducing a flow rate of $N_2$ gas in the chamber and increasing a pressure in the chamber to greater than about 4.0 mTorr while applying no sputtering power;
   c) controlling the flow rate of $N_2$ gas and the pressure in the chamber to define a first branch of a hysteresis by reducing the flow rate of $N_2$ gas in the chamber and reducing the pressure in the chamber through a range from about 4.0 mTorr to about 2.5 mTorr and applying sputtering power to sputter a nitride mode TiN film on the target;
   d) reducing the flow rate of $N_2$ gas and decreasing the pressure to less than 2.5 mTorr;
   e) controlling the flow rate of $N_2$ gas and the pressure in the chamber to define a second branch of the hysteresis by increasing the flow rate of $N_2$ gas and increasing the pressure through a range from about 2.5 mTorr to about 4 mTorr and applying sputtering power to sputter a metallic mode TiN film on the target;
   wherein the first branch of the hysteresis follows a path that is at a higher pressure than a path for the second branch of the hysteresis.

2. The method of claim 1 wherein step (d) is further characterized as
   stopping the flow rate of $N_2$ gas.

3. The method of claim 1 comprising step (f) following step (e) wherein
   the flow rate of $N_2$ gas is stopped.

4. A method of continuously forming a Ti/TiN film by sputtering from a common target onto a substrate disposed in a pressurizable process chamber in communication with a source of $N_2$, the method comprising the following steps:
   a) sputtering a Ti film onto the substrate;
   b) introducing a flow rate of $N_2$ gas in the chamber to greater than 40 sccm to increase a pressure in the chamber to greater than about 4.0 mTorr while applying no sputtering power;
   c) controlling the flow rate of $N_2$ gas and the pressure in the chamber to define a first branch of a hysteresis by reducing the flow rate of $N_2$ gas in the chamber through a range from about 40 sccm to about 20 sccm and reducing the pressure in the chamber through a range from about 4.0 mTorr to about 2.5 mTorr and applying sputtering power to sputter a nitride mode TiN film on the target;

d) reducing the flow rate of $N_2$ gas to less than 20 sccm and decreasing the pressure to less than 2.5 mTorr;

e) controlling the flow rate of $N_2$ gas and the pressure in the chamber to define a second branch of the hysteresis by increasing the flow rate of $N_2$ gas through a range from about 20 to about 40 sccm and increasing the pressure through a range from about 2.5 mTorr to about 4 mTorr and applying sputtering power to sputter a metallic mode TiN film on the target;

wherein the first branch of the hysteresis follows a path that is at a higher pressure than a path for the second branch of the hysteresis.

5. The method of claim 4 wherein step (d) is further characterized as reducing the flow rate of $N_2$ gas to about 0 sccm.

6. The method of claim 4 comprising step (f) following step (e) wherein reducing the flow rate of $N_2$ gas is reduced to about 0 sccm.

7. A method of continuously forming a Ti/TiN film by sputtering from a common target onto a substrate disposed in a pressurizable process chamber in communication with a source of $N_2$ and a source of inert gas, the method comprising the following steps:

a) introducing a flow rate of inert gas into the chamber and sputtering a Ti film on the substrate;

b) reducing the flow rate of inert gas and introducing a flow rate of $N_2$ gas in the chamber and increasing a pressure in the chamber to greater than 4.0 mTorr while applying no sputtering power;

c) controlling the flow rate of $N_2$ gas and the pressure in the chamber to define a first branch of a hysteresis by reducing the flow rate of $N_2$ gas in the chamber and reducing the pressure in the chamber through a range from about 4.0 mTorr to about 2.5 mTorr and applying sputtering power to sputter a nitride mode TiN film on the substrate;

d) reducing the flow rate of $N_2$ gas and decreasing the pressure to less than 2.5 mTorr;

e) controlling the flow rate of $N_2$ gas and the pressure in the chamber to define a second branch of the hysteresis by increasing the flow rate of $N_2$ gas and increasing the pressure through a range from about 2.5 mTorr to about 4 mTorr and applying sputtering power to sputter a metallic mode TiN film on the substrate;

f) stopping the flow rate of $N_2$ gas and increasing the flow rate of inert gas and sputtering a second Ti film on the substrate;

wherein the first branch of the hysteresis follows a path that is at a higher pressure than a path for the second branch of the hysteresis.

* * * * *